United States Patent
Kajiya et al.

(10) Patent No.: US 9,024,198 B2
(45) Date of Patent: May 5, 2015

(54) FLEXIBLE CIRCUIT BOARD AND METHOD FOR PRODUCTION THEREOF (75) Inventors: Atsushi Kajiya, Tokyo (JP); Hidekazu Yoshihara, Tokyo (JP); Toru Itani, Tokyo (JP)

(73) Assignee: Nippon Mektron, Ltd., Minato-Ku (JP)

( * ) Notice: Subject to any disclaimer, the term of this patent is extended or adjusted under 35 U.S.C. 154(b) by 333 days.

(21) Appl. No.: 13/518,470

(22) PCT Filed: Jul. 16, 2010

(86) PCT No.: PCT/JP2010/062057
§ 371 (c)(1),
(2), (4) Date: Jul. 30, 2012

(87) PCT Pub. No.: WO2011/077777
PCT Pub. Date: Jun. 30, 2011

(65) Prior Publication Data
US 2014/0102771 A1    Apr. 17, 2014

(30) Foreign Application Priority Data

Dec. 24, 2009  (JP) ................. 2009-292801

(51) Int. Cl.
*H05K 1/00*         (2006.01)
*H05K 1/03*         (2006.01)
(Continued)

(52) U.S. Cl.
CPC ............... *H05K 1/032* (2013.01); *H05K 1/028* (2013.01); *H05K 3/22* (2013.01); *H05K 1/0393* (2013.01);
(Continued)

(58) Field of Classification Search
CPC ..... H05K 1/0393; H05K 1/118; H05K 1/028; H05K 1/0283; H05K 1/189; H05K 1/147; H05K 3/4635; H05K 2201/2009; H05K 2201/0129; H03K 2203/1105
USPC .......................................... 174/254; 361/749
See application file for complete search history.

(56) References Cited

U.S. PATENT DOCUMENTS 3,300,572 A    1/1967  Dahlgren et. al.
5,341,806 A    8/1994  Gadsby et al.
(Continued)

FOREIGN PATENT DOCUMENTS

CN     1829412 A    9/2006
EP     0 509 689    10/1992
(Continued)

OTHER PUBLICATIONS

Japanese Office Action, Japanese Patent Application No. 2009-292801, dated Jun. 4, 2013 (4 pages).
(Continued)

*Primary Examiner* — Hoa C Nguyen (57) ABSTRACT

A flexible circuit board with high connection reliability and a manufacturing method thereof, wherein the flexible circuit board has a bent section formed thereon, can be deformed flexibly, and wherein a wiring layer will not be peeled off or ruptured even when deformation is repeated onto the flexible circuit board, heat is radiated from electronic parts, or minute wiring is formed on the flexible circuit board. The flexible circuit board is provided with an insulating film comprised of liquid crystal polymer, a wiring layer formed upon the insulating film, and an insulating layer comprised of liquid crystal polymer formed upon the wiring layer. The flexible circuit board has a bent section with a radius of curvature of R (mm) formed on at least one location thereof, and is made to be deformable in a state with the radius of curvature of the bent section maintained at R (mm).

4 Claims, 5 Drawing Sheets

(51) Int. Cl.
*H05K 1/02* (2006.01)
*H05K 3/22* (2006.01)
*H05K 3/42* (2006.01)
*H05K 3/46* (2006.01)

(52) U.S. Cl.
CPC .............. *H05K 3/429* (2013.01); *H05K 3/4635* (2013.01); *H05K 2201/0129* (2013.01); *H05K 2201/0141* (2013.01); *H05K 2201/09263* (2013.01); *H05K 2203/1105* (2013.01)

(56) References Cited

U.S. PATENT DOCUMENTS

| | | | |
|---|---|---|---|
| 5,397,503 A * | 3/1995 | Yuasa et al. | 252/299.01 |
| 5,747,743 A * | 5/1998 | Kato et al. | 174/254 |
| 5,906,507 A * | 5/1999 | Howard | 439/501 |
| 6,027,958 A * | 2/2000 | Vu et al. | 438/110 |
| 6,274,225 B1 | 8/2001 | Miyake et al. | |
| 6,568,947 B2 * | 5/2003 | Koch-Osborne | 439/165 |
| 8,106,301 B2 * | 1/2012 | Hsieh et al. | 174/135 |
| 2010/0132483 A1 * | 6/2010 | Thorne et al. | 73/863 |
| 2011/0274389 A1 * | 11/2011 | Kuroda et al. | 385/14 |

FOREIGN PATENT DOCUMENTS

| | | |
|---|---|---|
| EP | 1 009 200 A1 | 6/2000 |
| JP | 03-220787 A1 | 9/1991 |
| JP | 05-076070 U | 10/1993 |
| JP | 06-349650 A1 | 12/1994 |
| JP | 08-274417 A1 | 10/1996 |
| JP | 10-112571 A1 | 4/1998 |
| JP | 11-054873 | 2/1999 |
| JP | 11-290962 | 10/1999 |
| JP | 2000-042638 A1 | 2/2000 |
| JP | 2002-094191 | 3/2002 |
| JP | 2003-008161 A1 | 1/2003 |
| JP | 2003-170228 A1 | 6/2003 |
| JP | 2004-172185 A1 | 6/2004 |
| JP | 2006-228922 | 8/2006 |
| JP | 2007-134473 | 5/2007 |
| JP | 2007-305704 | 11/2007 |
| JP | 2008-153397 | 7/2008 |
| JP | 2008-159908 | 7/2008 |
| JP | 2008-192789 | 8/2008 |
| JP | 2008-210891 | 9/2008 |
| TW | 200642535 A | 12/2006 |

OTHER PUBLICATIONS

European Search Report, European Patent Application No. 10839014.7, dated Aug. 9, 2013 (7 pages).

Japanese Office Action (Application No. 2009-292801) dated Apr. 8, 2014.

International Search Report dated Aug. 31, 2010 (with English translation).

Chinese Office Action, Chinese Application No. 201080058828.2, dated Jun. 12, 2014 (7 pages).

Taiwanese Office Action (Application No. 099144732) dated Jan. 6, 2015.

* cited by examiner

FLEXIBLE CIRCUIT BOARD AND METHOD FOR PRODUCTION THEREOF

BACKGROUND OF THE INVENTION

1. Field of the Invention

The present invention relates to a flexible circuit board having a wiring layer formed directly or through an adhesive on a surface of an insulating film, and also relates to a method for production thereof. More specifically, the invention relates to a flexible circuit board and a method for production thereof, in which the flexible circuit board can be processed into an arbitrary shape, and in which the flexible circuit board can be used for connection between component parts which are mounted on various kinds of electronic equipment such as communication and visual equipment, etc., as well as automotive vehicles, aircrafts, robots, etc., and used for a mounting circuit board with components mounted thereon, and for a filament part on which a plurality of LEDs (Light Emitting Diodes) are mounted thereon and which is mounted on a lighting device.

2. Description of Related Art

As a conventional circuit board, there has been already known an all-layer IVH resin multilayered circuit board as disclosed, for example, in Japanese patent application laid-open No. 2003-008161 (first patent document). In addition, there has also been known a so-called flexible circuit board which is used with the whole or a part thereof being bent, and in recent years, such a flexible circuit board is used for a liquid crystal driver module of a portable device, etc.

Figure 5A:
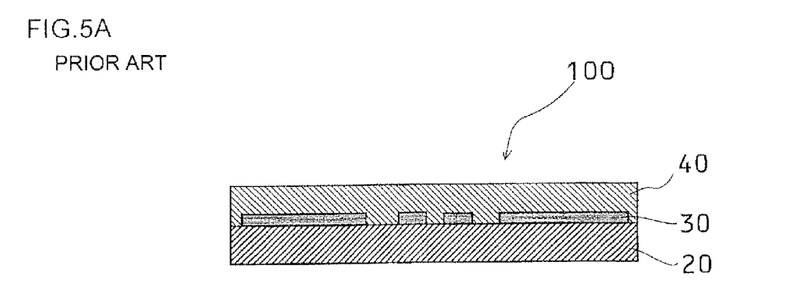
Figure 5B:
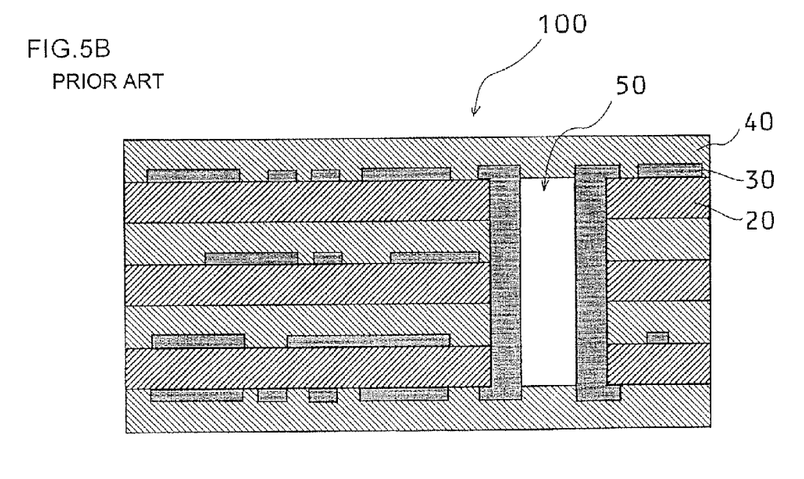

In FIG. 5, there are shown schematic cross sectional views of a typical flexible circuit board. As shown in FIG. 5A, a flexible circuit board 100 has a wiring layer 30 formed on an insulating film 20, and an insulating layer 40 (generally referred to as a cover lay layer (CL layer)) formed on the wiring layer 30. Moreover, as shown in FIG. 5B, there is also known a flexible circuit board which is formed of a plurality of these layers. As illustrated, a through hole 50 for electrically connecting individual wiring layers 30 to one another is formed in the multilayered flexible circuit board 100, so that complicated connections of wirings can be thereby made. In addition, the flexible circuit board 100 shown in FIG. 5A and FIG. 5B is in a form in which the wiring layer 30 is directly formed on the insulating film 20, but as another form, there is also known a flexible circuit board in which an adhesive layer is arranged between an insulating film and a wiring layer. Here, note that in the conventional flexible circuit board, polyimide films are used as the insulating film 20 and the insulating layer 40, respectively, and a rolled copper foil is used as the wiring layer 30.

The flexible circuit board having such a construction is thin and freely bendable, so that it can be inserted into a small space between component parts. As a result, many mounting components can be arranged even in the small space between the component parts, thus making it possible to improve packaging density in the space between the component parts. That is, with the use of the flexible circuit board in a bent state, it is possible to attain advancement in functionality and reduction in size of a device, and hence, in the future, the deployment of use thereof in still broader fields is expected. Here, note that related techniques are disclosed in the first through third patent documents, as listed below.

PRIOR ART REFERENCES

Patent Documents

First Patent Document: Japanese patent application laid-open No. 2003-008161

Second Patent Document: Japanese patent application laid-open No. H05-76070

Third Patent Document: Japanese patent application laid-open No. H10-112571

SUMMARY OF THE INVENTION

However, in the above-mentioned conventional flexible circuit board, there are the following problems.

When the above-mentioned conventional flexible circuit board is bent and unbent in a repeated manner, or is bent or folded in such a manner as to make its curvature large, the wiring layer (i.e., copper foil) may be exfoliated from an insulating material (i.e., the insulating film and the adhesive layer which is arranged in an arbitrary manner), or the wiring layer may be broken, in a bent or folded portion thereof, resulting from bending stress, and as a result, electrical connection defect (i.e., poor or defective electrical connection) may be caused. In addition, in cases where electronic parts are mounted with high density, there is a fear that electrical connection defect may occur resulting from heat dissipation of the flexible circuit board. That is, as an amount of heat released from the electronic parts increases, an amount of heat given to the flexible circuit board will differ to a large extent between at the time of the operation of the electronic parts and at the time of the stop or nonoperation thereof, as a result of which a large rise and fall in the temperature of the flexible circuit board will be repeated. According to this, the exfoliation or breakage of the wiring layer will occur due to the cause of the difference in thermal expansion between the insulating material and the wiring layer of the flexible circuit board.

In addition, a technique has been investigated in which the width of wiring of a flexible circuit board is made much finer in accordance with further advancement in functionality, further reduction in size and so on required for electronic equipment, so that electronic parts can be mounted on the flexible circuit board in much higher density, but as wiring is made finer and finer, the above-mentioned connection defect (i.e., exfoliation of a wiring layer from an insulating material, etc.) will be more liable to occur.

Here, note that, for example, in Japanese utility model application laid-open No. H5-76070 (second patent document), there is disclosed the construction of a flexible circuit board which can be used in a bent or folded state. Specifically, a metal reinforcing plate is bonded on the flexible circuit board, and thereafter, the metal reinforcing plate is subjected to bending work into a prescribed shape, whereby the flexible circuit board is bent together with the metal reinforcing plate. On the other hand, in Japanese patent application laid-open No. H10-112571, there is disclosed a technique in which polyethylenenaphthalate with a high modulus of elasticity is used for a circuit board, so that a rigid circuit member ensuring self-shape retentivity or maintenance is subjected to bending work into a predetermined shape. However, these circuit boards each having a bent portion have rigidity as a whole, so there is a problem that they are lacking in flexibility. As a result, it can not be said to be practical that these circuit boards are mounted on those portions such as, for example, moving portions of a robot, etc., for which elasticity is required.

That is, in the past, there has not been disclosed any flexible circuit board which is formed with a bent portion, and can be deformed in a flexible manner, and in which even if deformation is repeated, or if there is heat dissipation from electronic parts, or if fine wiring is formed, exfoliation and breakage of a wiring layer will not occur. Accordingly, the object of the present invention is to provide a flexible circuit board and a method for production thereof, which are high in connection reliability, and in which the flexible circuit board is formed with a bent portion and can be deformed in a flexible manner, and in which even if deformation is repeated, or if there is heat dissipation from electronic parts, or if fine wiring is formed, exfoliation and breakage of a wiring layer will not occur.

In order to achieve the above-mentioned object, the present invention resides in a flexible circuit board which has:

an insulating film made of a thermoplastic resin;

a wiring layer formed on said insulating film; and an insulating layer made of a thermoplastic resin and formed on said wiring layer;

and which characterized in that said flexible circuit board is formed in at least one place thereof with a bent portion having a radius of curvature R (mm); and said flexible circuit board is constructed such that it is deformable in a state in which the radius of curvature R (mm) of said bent portion is maintained.

According to such a construction, the bent portion having a radius of curvature R (mm) is formed in at least one place of the flexible circuit board, so the flexible circuit board can be deformed in an elastic manner, so that it can be inserted, in its bent or folded state, into a small space between component parts, for example. That is, by mounting the flexible circuit board so as conform to the shape of electronic equipment, etc., it is possible to intend to make the electronic equipment, etc., lighter, thinner, shorter and smaller as well as to reduce the number of mounting parts, while making effective use of a dead space in a mounting place of the flexible circuit board. Here, note that a plurality of bent portions may be formed, and for example, the flexible circuit board may be formed in a bellows shape. In this case, the flexible circuit board can be deformed in an elastic manner, so that it can also be used for those portions, such as movable parts of a robot as referred to above, for which elasticity is required. In addition, the flexible circuit board is constructed such that it is deformable in a state in which the radius of curvature R (mm) of the bent portion is maintained. As a result, even if the flexible circuit board is bent or unbent in a repeated manner, or is bent or folded so that the curvature thereof is made large, the stress applied to the bent portion can be alleviated with the entire flexible circuit board, thus making it possible for the bent portion to keep the fixed radius of curvature R (mm). Similarly, it is constructed such that in cases where the flexible circuit board is deformed by heat dissipation from electronic parts, the flexible circuit board is caused to deform in a state in which the radius of curvature R (mm) of the bent portion is maintained. Therefore, in the bent portion, the wiring layer can maintain its shape along the insulating film, and hence, there is a low possibility that exfoliation or breakage of the wiring layer will occur in the bent portion, thus making it possible to maintain excellent connection reliability. Moreover, the insulating film and the insulating layer are formed of the thermoplastic resin, so the flexible circuit board, which has become unnecessary, can be restored to its original shape by being heating again, which leads to recycling or reuse of resources. Here, note that "the wiring layer formed on the insulating film" referred to herein includes not only a case in which the wiring layer is directly formed on the insulating film, but also a case in which the wiring layer is formed on the insulating film through an adhesive layer, etc.

In addition, it is preferable that said radius of curvature R (mm) be equal to or more than 0.3 mm.

According to such a construction, in cases where the width of wiring is made further finer, the stress applied to the wiring layer in the bent portion can be suppressed to a level at which exfoliation and breakage of the wiring layer do not occur. As a result, it is possible to maintain higher connection reliability.

Moreover, it is preferable that said thermoplastic resin be a liquid crystal polymer.

According to such a construction, by the use of the liquid crystal polymer which is relatively inexpensive and easy to mold, it becomes possible to suppress production of the flexible circuit board.

In addition, in order to achieve the above-mentioned object, the present invention resides in a method for production of the above-mentioned flexible circuit board characterized by comprising:

a first step to form a bent portion with a radius of curvature R (mm) by bending the flexible circuit board by means of a shaping device in a state in which tension is applied to opposite ends of the flexible circuit board; and a second step to heat at least said bent portion of the radius of curvature R (mm), with respect to the flexible circuit board in a state in which the bent portion with the radius of curvature R (mm) is formed.

According to such a method for production, the bent portion can be formed with respect to the flexible circuit board, by means of a relatively simple production method, so that the cost of production of the flexible circuit board can be suppressed.

Moreover, preferably, in said first step, said shaping device, which has a curved portion, is pressed with its curved portion against said flexible circuit board from its opposite sides in a thickness direction thereof in an alternate manner, whereby a plurality of bent portions each having the radius of curvature R (mm) are formed in said flexible circuit board.

According to such a method for production, it is possible to produce a flexible circuit board having a plurality of bent portions such as, for example, a bellows structure in an easy manner.

Further, it is preferable that said first step and said second step be carried out by the use of said shaping device which is provided with a rubber-like elastic member in an area of contact thereof with said flexible circuit board in said first step and said second step.

According to such a method for production, the rubber-like elastic member functions as a shock absorbing member, thereby making it possible to protect the flexible circuit board from impact, friction, and so on. That is, even in cases where capacitors and LEDs are mounted on a surface of the flexible circuit board, there will be no fear that these mounted component parts may be crushed by means of the shaping device in production processes or steps. In addition, because the mounted component parts and the shaping device are in contact with each other through the rubber-like elastic member, heat does not directly conduct to the mounted component parts at the time of heating the shaping device, thus making it possible to prevent damage or breakage of the mounted component parts due to the heat.

In addition, it is preferable that said thermoplastic resin be a liquid crystal polymer, and it is also preferable that in said second step, a heating temperature be a temperature at which the surface temperature of said flexible circuit board becomes equal to or higher than 150 degrees C. and less than a thermal deformation starting temperature of the liquid crystal polymer, and a heating time be within 1 hour.

According to such a method for production, because the liquid crystal polymer is heated at the heating temperature which is less than the thermal deformation starting temperature of the liquid crystal polymer, the liquid crystal polymer is not fluidized to flow, and the external appearance and performance of the flexible circuit board are not impaired. In addition, because the heating temperature is such that the surface temperature of the flexible circuit board becomes equal to or higher than 150 degrees C., the bent portions can be shaped with respect to the liquid crystal polymer in a reliable manner, and besides, even after the heating is finished, the bent portions do not return to their original shapes (i.e., the radius of curvature R (mm) is maintained). Moreover, when the heating time is within 1 hour, the efficiency of production can be improved, and at the same time, it becomes possible to avoid problems of the discoloration and thermal deformation of the liquid crystal polymer, as well as damage to the wiring layer, which would otherwise be generated by heating for an extended period of time.

As described above, according to the present invention, it becomes possible to provide a flexible circuit board and a method for production thereof, in which the flexible circuit board is formed with a bent portion, can be deformed in a flexible manner, and besides does not generate exfoliation and breakage of a wiring layer, even in cases where the flexible circuit board is deformed in a repeated manner.

BRIEF DESCRIPTION OF THE DRAWINGS

FIG. 1 is schematic construction views of a flexible circuit board according to an embodiment of the present invention.

FIG. 2 is schematic diagrams showing a method for production of a flexible circuit board according to this embodiment of the present invention.

FIG. 3 is schematic diagrams showing a method for production of a flexible circuit board according to this embodiment of the present invention.

FIG. 4 is schematic views showing a method for elastic test according to this embodiment of the present invention.

FIG. 5 is schematic cross sectional views of a conventional flexible circuit board.

DETAILED DESCRIPTION AT THE INVENTION

Hereinafter, modes for carrying out the present invention will be described in detail by way of example with reference to the attached drawings. However, the dimensions, materials, shapes, relative arrangements and so on of component parts described in the following embodiment are not intended to limit the scope of the present invention to these alone in particular as long as there are no specific statements.

Embodiment

1: Schematic Construction Of Flexible Circuit Board

Figure 1A:
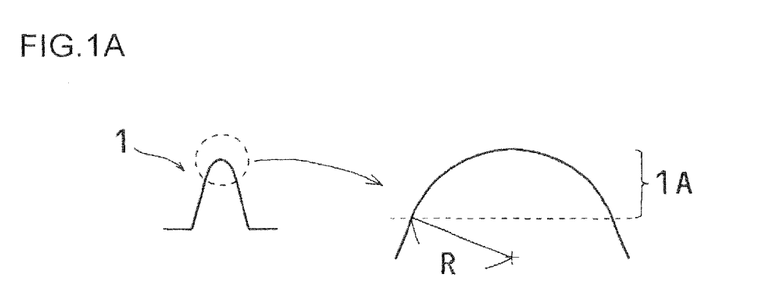
Figure 1B:
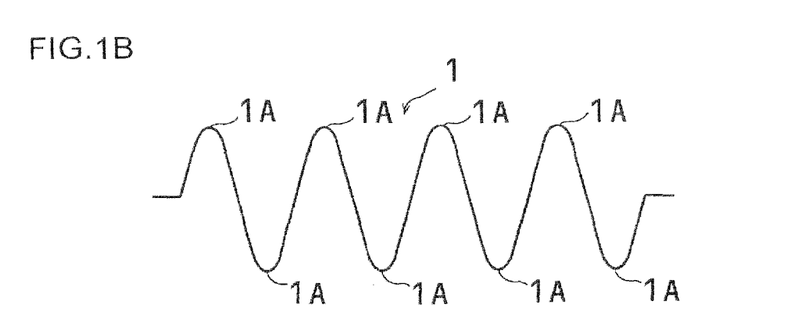
Figure 1C:
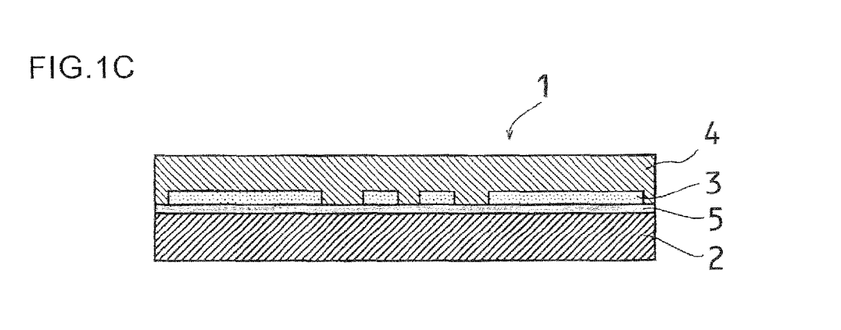
Figure 1D:
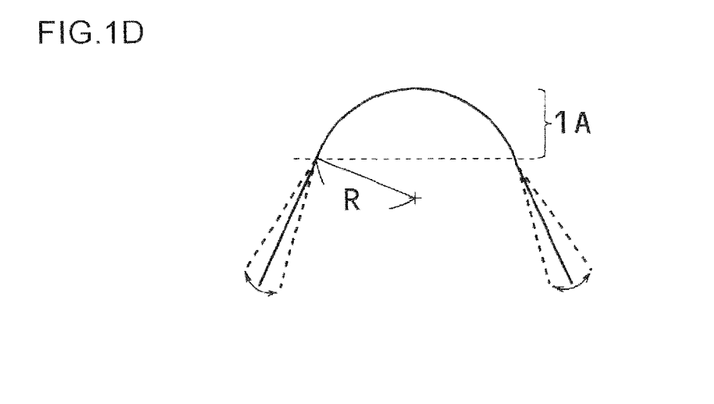

Reference will be made to the schematic construction of a flexible circuit board 1 according to this embodiment of the present invention, while referring to FIG. 1. FIG. 1A is a view which shows a bent portion 1A formed in the flexible circuit board 1 in an enlarged scale; FIG. 1B is a schematic construction view of the flexible circuit board 1; FIG. 1C is a schematic cross sectional view of the flexible circuit board 1; and FIG. 1D is a view showing behavior in the bent portion 1A of the flexible circuit board 1.

As shown in FIG. 1C, the flexible circuit board 100 is composed of an insulating film 2, a wiring layer 3 formed on the insulating film 2, and an insulating layer 4 formed on the wiring layer 3. Here, note that the wiring layer 3 is adhered to the insulating film 2 by means of an adhesive layer 5, but other constructions may be possible in which the adhesive layer 5 is not provided. In addition, as shown in FIG. 1B, the flexible circuit board 1 has a bent portion 1A (also referred to as a solid or three-dimensional forming part or a curved portion) with a radius of curvature R (mm) in at least one place thereof. Although in this embodiment, reference will be made to the flexible circuit board 1 in the shape of a bellows which has a plurality of bent portions 1A, the shape of the flexible circuit board 1 is not limited to this, but may have an approximately U-shaped form in which one bent portion 1A is provided in one place, for example.

The wiring layer 3 is formed by bonding a well-known metal foil, such as a rolled copper foil, an electrolytic copper foil, or the like, to the insulating film 2 by means of the adhesive layer 5. Alternatively, the wiring layer 3 can also be formed on a surface of the insulating film 2 (or a surface of the adhesive layer 5 formed on the insulating film 2) by means of an appropriate method such as vapor deposition, sputtering, or the like, by using a metal such as copper or silver. The adhesive layer 5 is formed by using a well-known thermoplastic resin such as polyimide, or a well-known thermosetting resin such as cyanate ester based resin, polyphenylene ether based resin, phenol based resin, naphthalene resin, urea resin, amino resin, alkyd resin, silicon resin, furan resin, unsaturated polyester resin, epoxy resin, polyurethane resin, etc. Alternatively, the adhesive layer 5 can also be formed of any of the above-mentioned organic resins with an inorganic filler such as silica, alumina or the like dispersed therein.

For the insulating film 2 and the insulating layer 4, there are recommended in particular thermoplastic resins for which heat resistance is required, and the following are preferred: liquid crystal polymer (e.g., trade name "RODRUN" made by Unitika, Ltd., "EPE" made by Mitsubishi Chemical Corporation, "IDEMITSU LCP" made by an Idemitsu Petrochemical Company, Ltd., "Ekonol" made by Sumitomo Chemical Co., Ltd., "XYDAR" made by Nippon Petro Chemicals Co., Ltd., "LCP" made by Tosoh Corporation, "VECTRA" made by Hoechst Celanese Corporation, "SRP" made by ICI, "VECSTAR" made by Kuraray Co., Ltd., "BIAC" made by Japan Gore Tex, Inc., "SUMIKASUPER LCP" made by Sumitomo Chemical Co., Ltd.); polyamide imides (e.g., polyamide imide obtained from trimellitic acid and aromatic diamines such as diaminodiphenylmethane, diaminodiphenyl ether, m-, or p-phenylenediamine, etc.); thermoplastic polyimide (e.g., trade name "AURUM", made by Mitsui Chemicals, Inc.), etc. The thermoplastic resins used for the insulating film 2 and the insulating layer 4 may be the same material, or different materials may be selected for them, respectively. Here, note that in the following, reference will be made to the case where a liquid crystal polymer is used for the insulating film 2 and the insulating layer 4.

As stated above, the flexible circuit board 1 according to this embodiment is formed in the shape of a bellows having bent portions 1A each of the radius of curvature R (mm) in a plurality of places. In the case of having such a shape, it becomes possible for the flexible circuit board 1 to carry out elastic deformation, and when an external force acts on the flexible circuit board 1, the flexible circuit board 1 as a whole can be deformed in an elastic manner, thereby making it possible to prevent stress from concentrating locally thereon. Moreover, the flexible circuit board 1 according to this embodiment has the following characteristic construction. That is, in general, in cases where such bent portions are formed in the flexible circuit board, when an external force acts thereon, stress will concentrate locally on the bent portions, so that the radius of curvature of each of the bent portions will be changed, thus causing the exfoliation and breakage of the wiring layers to occur. However, in this embodiment, by producing the flexible circuit board 1 according to a method for production thereof to be described later, it is possible to obtain the flexible circuit board 1 in which even it an external force acts thereon, the radius of curvature R (mm) of each of the bent portions 1A is maintained. That is, as shown in FIG. 1D, according to this embodiment, even if the flexible circuit board 1 is deformed (i.e., broken line portions in this figure), the radius of curvature R (mm) of each bent portion 1A can be kept constant, and hence, there is no fear that exfoliation and breakage of the wiring may occur in each bent portion 1A.

2: Method for Production of Flexible Circuit Board

Reference will be made to the method for production of the flexible circuit board 1 according to this embodiment of the present invention, while referring to FIG. 2.

Figure 2A:
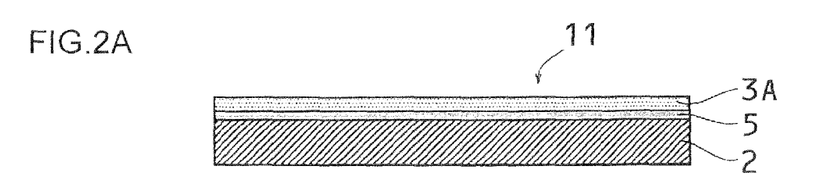
Figure 2B:
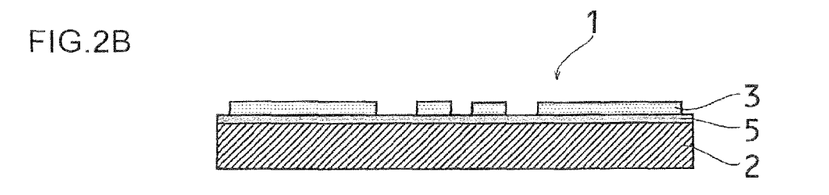
Figure 2C:
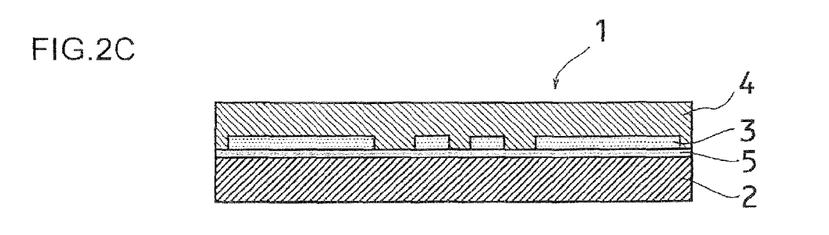

First, as shown in FIG. 2A, a metal-covered film 11 is prepared. The metal-covered film 11 can be formed by forming the adhesive layer 5 on a surface of the insulating film 2 made of a thermoplastic resin, laminating a metal foil 3A on a surface of the adhesive layer 5, and integrating these three layers with one another by means of thermocompression bonding. Here, note that as another technique of forming the metal-covered film 11, there are mentioned a technique of coating a varnish, which is a precursor of an insulating film, on a metal foil, and drying this precursor, a technique of forming a metal layer on an insulating film by vapor deposition or sputtering, a technique of forming a wiring layer on an insulating film, which is coated with a conductive paste, by means of electrolysis plating, and so on. Then, as shown in FIG. 2B, by etching the metal layer (the metal foil 3A) into a desired wiring pattern, the wiring layer 3 is formed, whereby the flexible circuit board 1 is obtained. Subsequently, as shown in FIG. 2C, the insulating layer 4 is formed by coating a thermoplastic resin on the wiring layer 3. Alternatively, the insulating layer 4 may be formed by bonding the insulating film made of a thermoplastic resin by means of thereto compression. As mentioned above, the single-sided flexible circuit board 1 having the insulating layer 4 is obtained according to the steps shown in FIGS. 2A-2C.

The flexible circuit board 1 according to this embodiment can adopt not only the above-mentioned single sided structure but also a multilayer structure which is shown in the following. Reference will be made to a method for production of a multilayer flexible circuit board having a three-layer structure, while referring to FIG. 3.

Figure 3A:
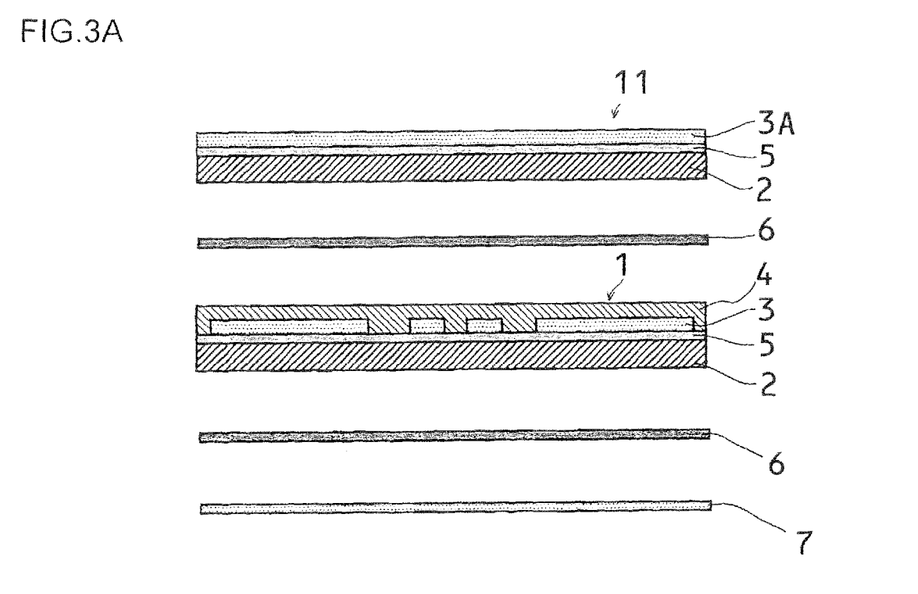

First, as shown in FIG. 3A, the metal-covered film 11 shown in FIG. 2A, the single-sided flexible circuit board 1 and a metal foil 7 are prepared, and in addition, two adhesive sheets 6 for joining these three sheets are prepared. As the adhesive sheets 6, there is used the thermoplastic resin for the above-mentioned insulating layer 4 which has been formed into the shape of a sheet. These are laminated in a manner as illustrated, and then, those which are thus laminated are thermally compressed to be integrated with one another.

Figure 3B:
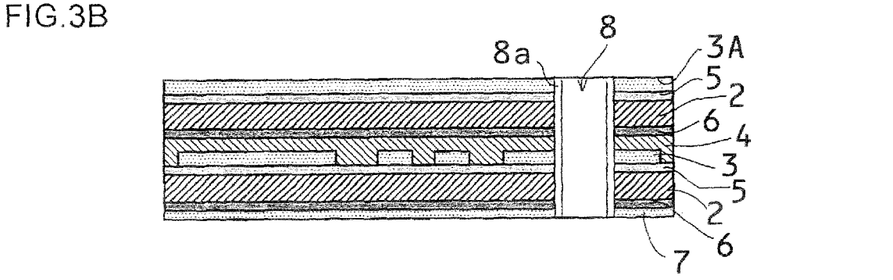

Thereafter, as shown in FIG. 3B, a through hole 8 is formed at a desired position by the use of a drill or laser, and is then subjected to through hole plating 8a, so that wiring layers 3 are electrically connected to one another. A form in which wiring layers are electrically connected to one another through the plating is shown in FIG. 3B, note that as another method, it is also possible to electrically connect between wiring layers by filling an electrically conductive paste into the through hole 8, and allowing the conductive paste to solidify.

Figure 3C:
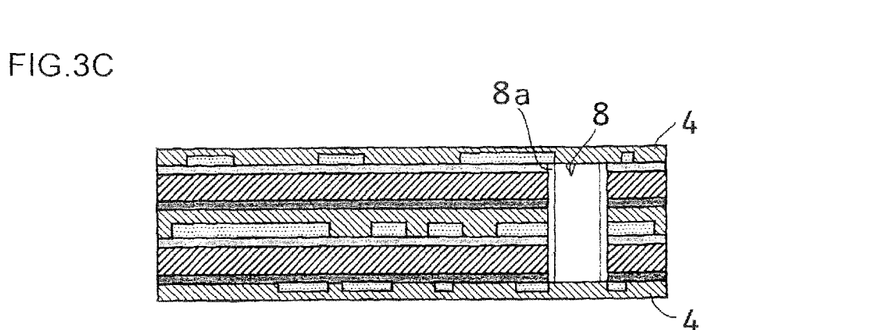

Then, as shown in FIG. 3C, the metal foils 3A, 7 disposed on the opposite respective surfaces are formed into the wiring layers 3 which have desired wiring patterns, respectively, by means of an appropriate technique such as etching, etc. Thereafter, insulating layers 4 are formed thereon, as in the above-mentioned technique (refer to FIG. 2C). As a result, a multilayer flexible circuit board having a three-layer structure can be produced. Note that a form having the three-layer structure has been described here, but the structure of the multilayer flexible circuit board is not limited to such a three-layer structure.

3: Shaping Method of Bent Portions

Figure 2D:
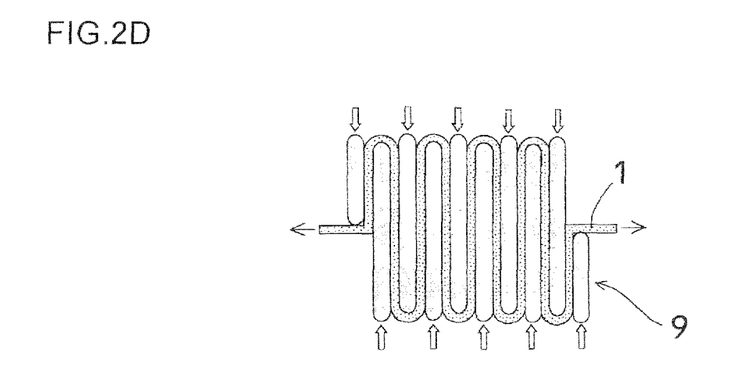

With reference to FIG. 2D, description will be given to a shaping method to form the bent portions 1A with respect to the flexible circuit board 1, after the flexible circuit board 1 has been produced according to the above-mentioned production method.

The method for production of the flexible circuit board 1 according to this embodiment includes a first step to form the bent portions 1A each with a radius of curvature R (mm) by bending the flexible circuit board 1 by means of a shaping device in a state in which tension is applied to opposite ends of the flexible circuit board 1, and a second step to heat at least the bent portions 1A each of the radius of curvature R (mm) which are formed in the flexible circuit board 1. In addition, in this embodiment, as the shaping device, there are provided a plurality of molds 9 (also referred to as partial molds) which are movable with respect to the flexible circuit board 1 from opposite sides thereof in a thickness direction of the flexible circuit board 1, and each of which has a curved portion at its tip.

In the first step, pulling the opposite ends of the flexible circuit board 1 by an unillustrated pulling means, the molds 9 are caused to move, with tension being applied to the opposite ends of the flexible circuit board 1, so that the tips of the molds 9 are pressed against the flexible circuit board 1 from the opposite sides in the thickness direction of the flexible circuit board 1. Because each of the molds 9 is formed at its tip with a curved portion, the plurality of bent portions 1A are formed in the flexible circuit board 1 by pressing the molds 9 against the flexible circuit board 1 from the opposite sides thereof in an alternate manner. The radius of curvature R (mm) of each of the bent portions 1A in this embodiment can be altered by changing the tip shape of each of the molds 9, and similarly, the number of the bent portions 1A, the interval of the bent portions 1A, and so on can be set optionally by altering the number and the interval of the molds 9 in a suitable manner. Here, note that among the molds 9 arranged on the opposite sides in the thickness direction of the flexible circuit board 1, at least those which are arranged at one side thereof should just be constructed so as to be movable with respect to the flexible circuit board 1. In addition, the pressure applied at the time of pressing the flexible circuit board 1 by the molds 9 should just be an applied pressure by which the bent portions 1A are at least formed in the flexible circuit board 1 in a reliable manner, and the applied pressure can be altered in a suitable manner in accordance with the thickness, the material, etc., of the flexible circuit board 1.

In the second step, with respect to the flexible circuit board 1 in which the plurality of bent portions 1A are formed by means of the molds 9 being pressed thereagainst with tension applied to the opposite ends thereof, at least the bent portions 1A are heated. Although in this embodiment, the flexible circuit board 1 is heated by putting the flexible circuit board 1 with the bent portions 1A formed therein into a heating device together with the molds 9, it may be constructed such that a heating member is arranged in the interior of each of the molds 9, whereby at least the bent portions 1A of the flexible circuit board 1 are heated by the heat generated from the molds 9. Here, note that in this embodiment, the temperature of heating is set to a temperature at which the surface temperature of the flexible circuit board 1 becomes equal to or higher than 150 degrees C. and less than a thermal deformation starting temperature of the liquid crystal polymer, and the time of heating is set within 1 hour. When the heating is carried out at the temperature at which the surface temperature of the flexible circuit board 1 is equal to or higher than 150 degrees C. and less than the thermal deformation starting temperature of the liquid crystal polymer, the liquid crystal polymer is not fluidized to flow, and the external appearance and performance of the flexible circuit board 1 are not impaired. In addition, because the heating temperature is the temperature at which the surface temperature of the flexible circuit board 1 becomes equal to or higher than 150 degrees C., the bent portions 1A can be formed with respect to the liquid crystal polymer in a reliable manner, and moreover, even after the heating is finished, the bent portions 1A do not return to their original shapes (i.e., the radius of curvature R (mm) is maintained). Further, when the heating time is within 1 hour, the efficiency of production can be improved, and at the same time, it becomes possible to avoid problems of the discoloration and thermal deformation of the liquid crystal polymer, as well as damage to the wiring layer 3, which would otherwise be generated by heating for an extended period of time. Note that herein is described the case where the liquid crystal polymer is used for the insulating film 2 and the insulating layer 4, but as stated above, materials which can be applied to the insulating film 2 and the insulating layer 4 are not limited to this. In cases where another material is selected, the bent portions 1A can be formed by altering the above-mentioned heating temperature and heating time in a suitable manner (however, an upper limit of the heating temperature is a temperature which becomes less than the thermal deformation starting temperature of the material thus selected).

By carrying out the first step and the second step as referred to above, it becomes possible to produce the flexible circuit board 1 which has the radius of curvature R (mm) in at least one place and which can be deformed in an elastic manner in a state where the radius of curvature R (mm) is maintained. Here, note that the first step and the second step may be carried out at the same time. That is, there can also be adopted a method of bending the flexible circuit board 1 by means of the molds 9, while heating those portions which correspond to the bent portions 1A. Also, note that it is preferable that the molds 9 be each provided with a rubber-like elastic member in an area of contact thereof with the flexible circuit board 1 in the first step and the second step. According to such a construction, each rubber-like elastic member functions as a shock absorbing member, thereby making it possible to protect the flexible circuit board 1 from impact, friction, and so on. That is, even in cases where capacitors and LEDs are mounted on a surface of the flexible circuit board 1, there will be no fear that these mounted component parts may be crushed by means of the molds 9 in the production processes or steps. In addition, because the mounted component parts and the molds 9 are in contact with each other through the rubber-like elastic members, heat does not directly conduct to the mounted component parts, thus making it possible to prevent damage or breakage of the mounted component parts due to the heat. The rubber-like elastic members or materials are not limited in particular as long as they have wear resistance, shock resistance, buckling resistance, etc. For example, urethane rubber, chloroprene rubber, NBR, fluororubber, silicone rubber, natural rubber, etc., can be used.

4: Verification of Effects

In order to verify the effects of the flexible circuit board and the method for production thereof according to this embodiment, comparisons between this embodiment and comparative examples were carried out under verification experiments shown below. The result of the verification will be described hereinafter.

Figure 4A:
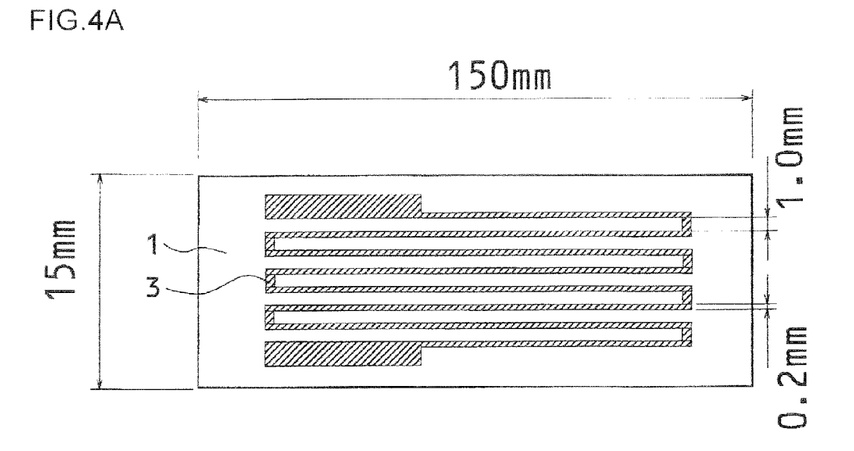

First, in a first through a fifth comparative example, as a copper-covered film, there was prepared Esperflex (trade name) (made of Sumitomo Metal Mining, Co., Ltd., polyimide film: Kapton-EN, film thickness: 50 μm, thickness of copper foil: 18 μm) which is a two-layer single-sided copper-covered polyimide film. In addition, in a sixth through a tenth comparative example, as a copper-covered film, there was prepared a single-sided copper-covered three-layer polyimide film (polyimide film: Kapton-EN, film thickness: 50 μm, thickness of rolled copper foil: 18 μm, adhesive: epoxy resin, thickness of adhesive layer: 10 μm). Subsequently, etching processing was carried out on these samples, so that a wiring layer 3 having a wiring pattern as shown in FIG. 4A was formed, and a single-sided flexible circuit board 1 was obtained. The width of the circuit board, the width of wiring, and so on are as shown in this figure. Here, note that the polyimide film, Kapton-EN, used herein has a thermosetting property, and the circuit boards of the first through tenth comparative example and the flexible circuit board 1 according to this embodiment are different from each other at least in this point.

Subsequently, the single-sided flexible circuit board was shaped under the conditions (a radius of curvature (mm), surface temperatures (degrees C.) of the board, ae shaping time (h)) which are described in Table 1. Note that here, the same ones as the molds 9 used in this embodiment were used as the shaping device.

TABLE 1

| Sample | Radius of curvature (mm) | Surface temperature (degrees C.) | Shaping time (h) |
|---|---|---|---|
| Comparative example 1 | 1.0 | 100 | 1 |
| Comparative example 2 | 1.0 | 150 | 1 |
| Comparative example 3 | 1.0 | 200 | 1 |
| Comparative example 4 | 1.0 | 250 | 1 |
| Comparative example 5 | 1.0 | 300 | 1 |
| Comparative example 6 | 1.0 | 100 | 1 |
| Comparative example 7 | 1.0 | 150 | 1 |
| Comparative example 8 | 1.0 | 200 | 1 |
| Comparative example 9 | 1.0 | 250 | 1 |
| Comparative example 10 | 1.0 | 300 | 1 |

Figure 4B:
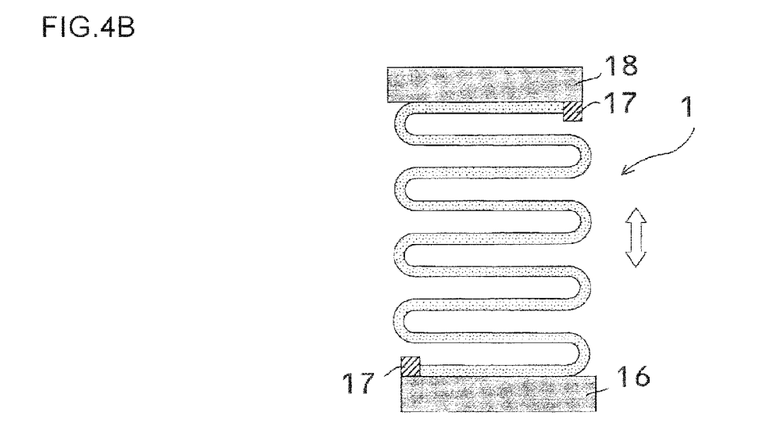

In order to evaluate the connection reliability of each sample thus obtained, a "repeated expansion and contraction test" was carried out. A test method will be briefly described with reference to FIG. 4B. FIG. 4B schematically shows a device for carrying out the "repeated expansion and contraction test". First, in carrying out the test, the opposite ends of each flexible circuit board 1 to be tested are fixedly secured at fastening portions 17 to a stationary plate 16 and a vertically movable plate 18, respectively. At this time, the distance between the stationary plate 16 and the vertically movable plate 18 in a contracted state of each flexible circuit board 1 was set to be the sum of the radii of curvature R (mm) of the flexible circuit board 1. In addition, the distance between the stationary plate 16 and the vertically movable plate 18 in an expanded state of each flexible circuit board 1 was set to be as five times as large as the sum of the radii of curvature of the flexible circuit board 1. Subsequently, the vertically movable plate 18 was moved to reciprocate in the vertical direction, 100,000 times at a speed of 100 mm/second. Thereafter, those flexible circuit boards in which the resistance value of the wiring layer 3 after the expansion and contraction thereof increased by 10% or more from that before the expansion and contraction were assumed to be "defective". The number of tests (N) was set to 20 for each sample. The results of such tests are shown in Table 2. Here, note that "success or failure in shape maintenance" in Table 2 is an evaluation on whether the radius of curvature R (mm) of each bent portion was maintained with respect to the shape thereof after the tests. In addition, "success or failure in shaping" is an examination as to whether bent portions of the radius of curvature R (mm) were formed, after each flexible circuit board was taken out from the molds 9.

Here, note that in Table 2, the criteria for the success or failure in shaping and the criteria for the success or failure in shape maintenance are defined as follows.

O: the radius of curvature is less than ±10% of a design value;

Δ: the radius of curvature is equal to or more than ±10% and less than ±20% of the design value; and X: the radius of curvature is equal to or more than ±20% of the design value.

Also, the criteria for the external appearance are defined as follows.

O: the outflow of the insulating film or the insulating layer is not recognized; and X: the outflow of the insulating film or the insulating layer is recognized.

TABLE 2

| Sample | success or failure in shaping | success or failure in shape maintenance | external appearance | Number of occurrence of defects (N = 20) |
|---|---|---|---|---|
| Comparative example 1 | X | — | — | — |
| Comparative example 2 | X | — | — | — |
| Comparative example 3 | X | — | — | — |
| Comparative example 4 | X | — | — | — |
| Comparative example 5 | X | — | — | — |
| Comparative example 6 | X | — | — | — |
| Comparative example 7 | X | — | — | — |
| Comparative example 8 | Δ | X | O | 8 |
| Comparative example 9 | Δ | X | O | 9 |
| Comparative example 10 | Δ | X | O | 12 |

From Table 2, it has been found that in the first comparative example through the seventh comparative example, no bent portion was formed in flexible circuit boards even if the flexible circuit boards were heated. In addition, it has also been found that in the eighth comparative example through the tenth comparative example, bent portions were formed when the flexible circuit boards were heated, but when the above-mentioned expansion and contraction tests were carried out, the radius of curvature R (mm) of each bent portion was changed to a large extent, and it was difficult for each bent portion to maintain the radius of curvature R (mm) thereof.

Accordingly, similar tests were carried out with respect to the following samples A through E. The conditions of the samples A through E were as follows.

In the samples A through E, the liquid crystal polymer was used for the insulating film 2 and the insulating layer 4, similar to this embodiment. That is, first, as a copper-covered film, there was prepared Esperflex L (trade name) (made by Nippon Steel Chemical Co., Ltd., film thickness: 50 µm, thickness of rolled copper foil: 18 µm, thermal deformation starting temperature: 290 degrees C.) which is a single-sided copper-covered liquid crystal polymer film. Subsequently, etching processing was carried out on these samples, so that a wiring layer 3 having a wiring pattern as shown in FIG. 4A was formed, and a single-sided flexible circuit board 1 was obtained. The width of the circuit board, the width of wiring, and so on are as shown in this figure. Then, bent portions 1A were formed in the flexible circuit board 1 under the conditions as shown in Table 3, and the above-mentioned expansion and contraction tests were carried out on the flexible circuit board 1 with the bent portions 1A thus formed therein. The results of the tests are shown in Table 4.

TABLE 3

| Sample | Radius of curvature (mm) | Surface temperature (degrees C.) | Shaping time (h) |
|---|---|---|---|
| A | 1.0 | 100 | 1 |
| B | 1.0 | 150 | 1 |
| C | 1.0 | 200 | 1 |
| D | 1.0 | 250 | 1 |
| E | 1.0 | 300 | 1 |

TABLE 4

| Sample | success or failure in shaping | success or failure in shape maintenance | external appearance | Number of occurrence of defects (N = 20) |
|---|---|---|---|---|
| A | X | — | — | — |
| B | O | Δ | O | 0 |
| C | O | O | O | 0 |
| D | O | O | O | 0 |
| E | Δ | X | X | 15 |

From the results of the tests shown in Table 4, it has been found that when the flexible circuit board 1 is heated so as to raise the surface temperature thereof to 100 degrees C., it is difficult to form the bent portions 1A themselves, as in the case of the sample A. On the other hand, it has also been found that when the flexible circuit board 1 is heated so that the surface temperature thereof becomes 300 degrees C., as in the case of the sample E, the thermal deformation starting temperature of the liquid crystal polymer will be exceeded, and hence, the thermal deformation of the liquid crystal polymer will begin and the liquid crystal polymer will be fluidized to flow. That is, it has been found that even if the bent portions 1A are formed, it is difficult to maintain the radius of curvature R (mm) of each of the bent portions 1A after heating thereof. In addition, because the liquid crystal polymer is fluidized to flow, it has been confirmed that the external appearance does not reach an acceptable level, either. Here, it has been found that when the surface temperature of the flexible circuit board 1 is equal to or higher than 150 degrees C. and less than the thermal deformation starting temperature of the liquid crystal polymer, as in the case of the samples B through D, the bent portions 1A can be formed, and even after the above-mentioned tests have been carried out, the radius of curvature R (mm) of each of the bent portions 1A are maintained, and in addition, the external appearance is also at an acceptable level. That is, it can be said that the temperature of "150 degrees C." is a lower limit heating temperature at which the bent portions 1A can be formed and the radius of curvature R (mm) of each of the bent portions 1A thus formed can be maintained even if the expansion and contraction tests are carried out (although the liquid crystal polymer is used in this embodiment, this temperature can also be of course changed in cases where other materials are used). Note that the heating time is here set to 1 hour, but according to inventors' keen study and examination, it has been found that even if the heating time is less than 1 hour, "the success in shaping", "the success in shape maintenance", and "the external appearance" each sufficiently reach an acceptable level.

From the foregoing, the following can be said.

In the case of using a thermosetting resin, the bent portions can not be formed, or the radius of curvature R (mm) of each of the bent portions can not be maintained.

It has been found that in the case of using a thermoplastic resin (i.e., in the case of the liquid crystal polymer), the bent portions 1A can be formed when the heating temperature is a temperature at which the surface temperature of the flexible circuit board becomes equal to or higher than 150 degrees C. and less than the thermal deformation starting temperature of the liquid crystal polymer, and when the shaping time is within 1 hour, and even if the above-mentioned expansion and contraction tests are carried out, the radius of curvature R (mm) of each of the bent portions 1A can be maintained. In addition, it has been found that the external appearance is also at an acceptable level.

Next, the radius of curvature R (mm) was considered. Here, the flexible circuit boards 1 of the same constructions as those of the sample A through the sample E were shaped with the radius of curvature R (mm)=0.1 mm (sample F) and 0.3 mm (sample G), respectively, under the conditions in which the surface temperature of the flexible circuit boards 1 at the time of heating was 200 degrees C., and the shaping time was 1 hour, and then, the above-mentioned expansion and contraction tests were carried out. The shaping conditions are shown in Table 5, and the results of such tests are shown in Table 6.

TABLE 5

| Sample | Radius of curvature (mm) | Surface temperature (degrees C.) | Shaping time (h) |
|---|---|---|---|
| F | 0.1 | 200 | 1 |
| G | 0.3 | 200 | 1 |

TABLE 6

| Sample | success or failure in shaping | success or failure in shape maintenance | external appearance | Number of occurrence of defects (N = 20) |
|---|---|---|---|---|
| F | ○ | ○ | ○ | 10 |
| G | ○ | ○ | ○ | 0 |

As a result, in the case of the radius of curvature R (mm) =0.1 mm, "the success in shaping", "the success in shape maintenance", and "the external appearance" were at acceptable levels, respectively, but "defects" occurred in a proportion of about half of the whole. This is considered that the radius of curvature R (mm) of each of the bent portions 1A is maintained, but the radius of curvature R (mm) is small (i.e., the curvature is large), and hence, the wiring layer 3 receives stress in the bent portions 1A, so that exfoliation and breakage thereof are liable to occur. In addition, it is considered that the number of occurrence of "defects" will increase further as the wiring is made finer. On the other hand, in the case of the radius of curvature R (mm)=0.3 mm, "the success in shaping", "the success in shape maintenance", and "the external appearance" were at acceptable levels, respectively, and no "defect" occurred. That is, it can be understood that in order to prevent the exfoliation and breakage of the wiring in the bent portions 1A in a more reliable manner thereby to further improve the reliability of connection, it is preferable that the radius of curvature R (mm) be 0.3 mm or more.

From the foregoing, according to this embodiment, in a flexible circuit board having a bent portion formed therein, it becomes possible to provide the flexible circuit board and its production method in which the flexible circuit board is deformable in a flexible manner, and in which even if deformation of the board is repeated, or if there is heat dissipation from electronic parts, or if fine wiring is formed, exfoliation and breakage of a wiring layer will not occur, and connection reliability is high.

EXPLANATION OF REFERENCE NUMERALS AND CHARACTERS

1 . . . flexible circuit board
1A . . . bent portions
2 . . . insulating film
3 . . . wiring layer
4 . . . insulating layer
5 . . . adhesive layer cm The invention claimed is:

The invention claimed is:

1. A flexible circuit board which has:
an insulating film made of a thermoplastic resin;
a wiring layer formed on said insulating film; and
an insulating layer made of a thermoplastic resin and formed on said wiring layer; wherein
said flexible circuit board is formed in at least one place thereof with a bent portion having a radius of curvature R (mm) by deforming the thermoplastic resins themselves;
said flexible circuit board is constructed such that it is deformable in a state in which the radius of curvature R (mm) of said bent portion is maintained,
said radius of curvature R (mm) is equal to or than 0.3 mm; and
said thermoplastic resin is a liquid crystal polymer.

2. A method for production of a flexible circuit board as set forth in claim 1, comprising:
a first step to form a bent portion with a radius of curvature R (mm) by bending the flexible circuit board by means of a shaping device in a state in which tension is applied to opposite ends of the flexible circuit board; and
a second step to heat at least said bent portion of the radius of curvature R (mm), with respect to the flexible circuit hoard in a state in which the bent portion with the radius of curvature R (mm) is formed; wherein
said means of said shaping device has a plurality of molds which is formed at a tip with a curved portion, and
in said first step, the molds are pressed with the curved portion against said flexible circuit board from opposite sides in a thickness direction thereof in an alternate manner, whereby a plurality of bent portions each having the radius of curvature R (mm) is formed in said flexible circuit board.

3. The method for production of a flexible circuit board as set forth in claim 2, wherein said first step and said second step are carried out by using said shaping device which is provided with a rubber-like elastic member in an area of contact thereof with said flexible circuit board in said first step and said second step.

4. The method for production of a flexible circuit board as set forth in claim 2, wherein in said second step, a heating temperature at which the surface temperature of said flexible circuit board becomes equal to or higher than 150 degrees C. and less than a thermal deformation starting temperature of the liquid crystal polymer, and a heating time is within 1 hour.

* * * * *